(12) United States Patent
Dussinger et al.

(10) Patent No.: US 6,712,128 B1
(45) Date of Patent: Mar. 30, 2004

(54) CYLINDRICAL FIN TOWER HEAT SINK AND HEAT EXCHANGER

(75) Inventors: Peter M. Dussinger, Lititz, PA (US); David Sarraf, Elizabethtown, PA (US)

(73) Assignee: Thermal Corp., Stanton, DE (US)

( * ) Notice: Subject to any disclaimer, the term of this patent is extended or adjusted under 35 U.S.C. 154(b) by 0 days.

(21) Appl. No.: 10/300,094

(22) Filed: Nov. 20, 2002

(51) Int. Cl.⁷ ................................................. H05K 7/20
(52) U.S. Cl. ..................... 165/80.3; 165/182; 165/185; 361/704
(58) Field of Search ................ 165/80.3, 121, 165/182, 185; 361/697, 704, 710

(56) References Cited

U.S. PATENT DOCUMENTS

| | | | |
|---|---|---|---|
| 2,879,976 A | * | 3/1959 | Rose, Sr. .................. 165/122 |
| 3,457,988 A | * | 7/1969 | Meyerhoff et al. .......... 165/80.3 |
| 3,537,517 A | * | 11/1970 | Meyerhoff et al. .......... 165/182 |
| 4,715,438 A | | 12/1987 | Gabuzda et al. |
| 4,733,293 A | | 3/1988 | Gabuzda |
| 4,753,290 A | | 6/1988 | Gabuzda |
| 5,132,780 A | | 7/1992 | Higgins, III |
| 5,351,166 A | * | 9/1994 | Kang ..................... 361/690 |
| 5,484,013 A | | 1/1996 | Morikawa et al. |
| 5,523,918 A | | 6/1996 | Chiou |
| 5,661,638 A | | 8/1997 | Mira |
| 5,784,257 A | | 7/1998 | Tata |
| 5,943,209 A | | 8/1999 | Liu |
| 6,199,624 B1 | | 3/2001 | Wotring |
| 6,360,816 B1 | * | 3/2002 | Wagner ................... 165/122 |
| 6,450,250 B2 | * | 9/2002 | Guerrero ............... 165/104.33 |

FOREIGN PATENT DOCUMENTS

| | | |
|---|---|---|
| EP | 1 081 760 A2 | 3/2001 |
| FR | 1.467.264 A * | 12/1966 |

OTHER PUBLICATIONS

Molex Brochure; Thermal Acoustic Products; 8 pages; 2001.
Molex Brochure; Thermal Acoustic Products Application Specification; 7 page; Jan. 2001.
Molex.com; 4 internet pages; Thermal Acoustic Products, Aug. 2001.

* cited by examiner

*Primary Examiner*—Allen Flanigan
(74) *Attorney, Agent, or Firm*—Duane Morris LLP (57) ABSTRACT

An air flow apparatus including an elongate post and a plurality of fin disks disposed on the elongate post, each fin disk including a centrally disposed opening therein for receiving the elongate post, and a plurality of flow openings disposed around the periphery of the centrally disposed opening. The air flow apparatus is preferably used in conjunction with a circulation device to form a heat exchanger.

10 Claims, 10 Drawing Sheets

CYLINDRICAL FIN TOWER HEAT SINK AND HEAT EXCHANGER

FIELD OF THE INVENTION

The present invention relates to a method and apparatus for removing heat from electronic equipment, and in particular, a heat exchanger system for removing heat from semiconductor chips.

DESCRIPTION OF THE RELATED ART

In the computer industry there is a need for low cost, high performance heat exchangers to cool components such as microprocessors and semiconductor chips. Heat exchangers often utilize heat sink mechanisms, such as spreaders and fins, to draw heat away from heat-producing components (e.g., microprocessors). Heat exchangers also typically include some type of circulation unit (e.g., fan, fluid loop, etc.) for further assisting in moving heat away from the heat-producing components.

European Patent Application No. EP 1,081,760 (A2) discloses a heat sink assembly 10 including a heat exchanger 18 and a cylindrical heat sink including a plurality of fins 28. The heat sink assembly 10 also includes a fan assembly 12 disposed on one side of the heat exchanger 18, and a base assembly 20 including a heat-producing electronic component 38 disposed on an opposing side of the heat exchanger. The heat sink is formed from a thermally conductive sheet 22 that is folded to form alternating ridges 24 and troughs 26. The thermally conductive sheet 22 is disposed around a conductive rod 40 which abuts the electronic component 38 on one end, and the fan assembly 12 on the other end.

However, there are several drawbacks to the above-described heat sink assembly. One drawback is that the conductive rod 40 carrying the heat sink merely lies on top of the electronic component 38. Thus, the weight of the fan assembly 12 is the only thing securing the rod and the heat sink to the component. This is a problem because a complex bracket system 54 and a heavy fan are necessary to hold the rod 40 and heat sink against the electronic component 38. Another drawback is that the folded heat sink structure must be formed by folding a flat thermally conductive sheet into a cylindrical form. The machinery required for performing such folding is often expensive and complex. Moreover, a manufacturer may experience difficulty folding thicker sheets.

Therefore, there is currently a need for a heat exchanger system which is simpler and easier to produce than present systems.

SUMMARY OF THE INVENTION

The present invention comprises an air flow apparatus comprising an elongate post and a plurality of fin disks disposed on the elongate post, each fin disk including a centrally disposed opening for receiving the elongate post, and a plurality of flow openings disposed around the periphery of the centrally disposed opening.

The present invention also comprises a heat exchanger system comprising an air flow apparatus including an elongate post and a plurality of fin disks disposed on the elongate post, each fin disk including a centrally disposed opening for receiving the elongate post, and a plurality of flow openings disposed around the periphery of the centrally disposed opening and, a circulation device.

The above and other advantages and features of the present invention will be better understood from the following detailed description of the exemplary embodiments of the invention which is provided in connection with the accompanying drawings.

DETAILED DESCRIPTION

The present invention comprises an apparatus and method for removing heat from heat-producing equipment. The apparatus according to the exemplary embodiments of the present invention is preferably coupled to a heat pipe, microprocessor, semiconductor device or other heat-producing member.

A first exemplary embodiment of the present invention comprises a fin stack 100 and fin disks 120. Fin stack 100 is preferably utilized as an integral part of a heat exchanger apparatus 500, which is explained in detail below with reference to FIGS. 7 and 8. Fin stack 100 comprises an elongate post 110 that is centrally disposed on a plurality of fin disks 120. Elongate post 110 includes a base portion 111 and a column portion 112, and is preferably formed from Copper (Cu) or some other heat conducting material. Fin disks 120 include alignment notches 129 which are used for aligning the fin disks on elongate post 110 (as explained below with reference to FIG. 7). Fin disks 120 are preferably formed of plastic, but may be formed of any suitable engineering material. Fin disks 120 are explained in more detail below with reference to FIG. 2.

Figure 1:
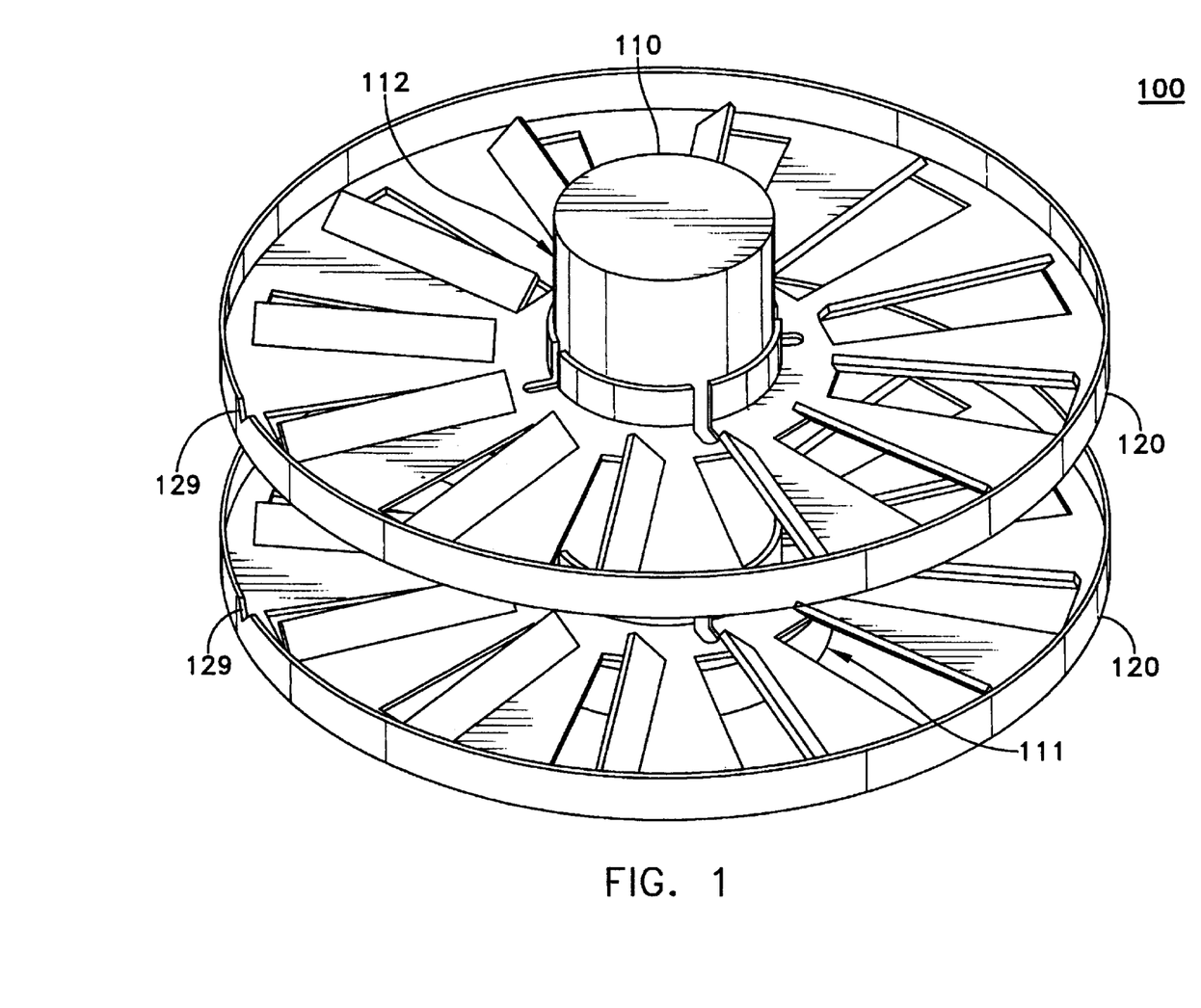
FIG. 1 shows a fin stack according to a first exemplary embodiment of the present invention.
Figure 2:
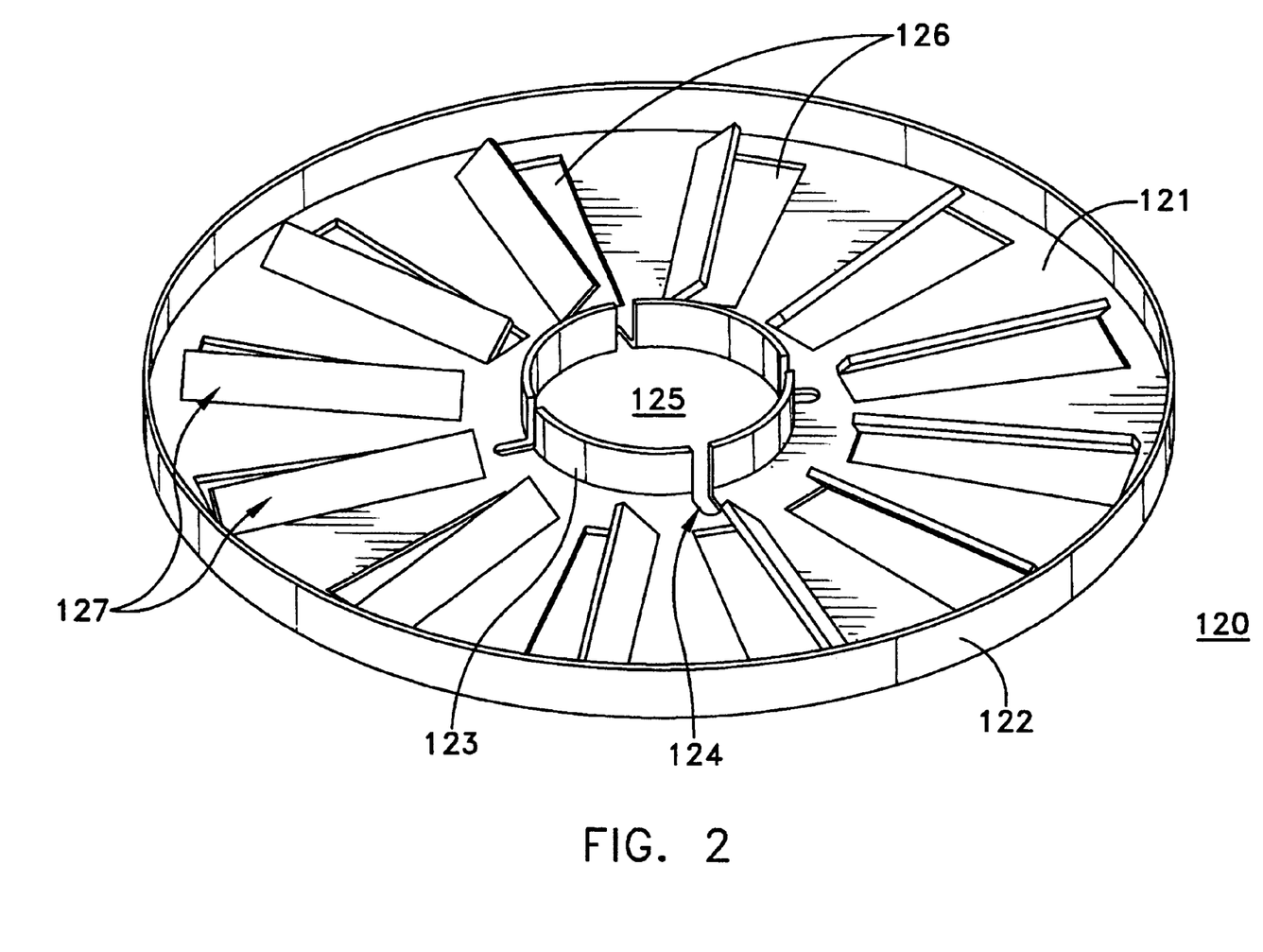
FIG. 2 shows an individual fin disk according to a first exemplary embodiment of the present invention.

FIG. 2 shows a single fin disk 120 as discussed above with reference to FIG. 1. Fin disk 120 comprises a substantially circular base 121 having a continuous annular lip 122 disposed on its outer peripheral edge. Base 121 also includes a centrally-disposed substantially circular opening 125 for receiving column portion 112 of elongate post 110 (See FIG. 1). A centrally-disposed annular lip 123, including a plurality of slots 124, surrounds opening 125. Base 121 also includes a plurality of flow openings 126, and a plurality of flow guides 127 disposed adjacent flow openings 126.

Figure 3:
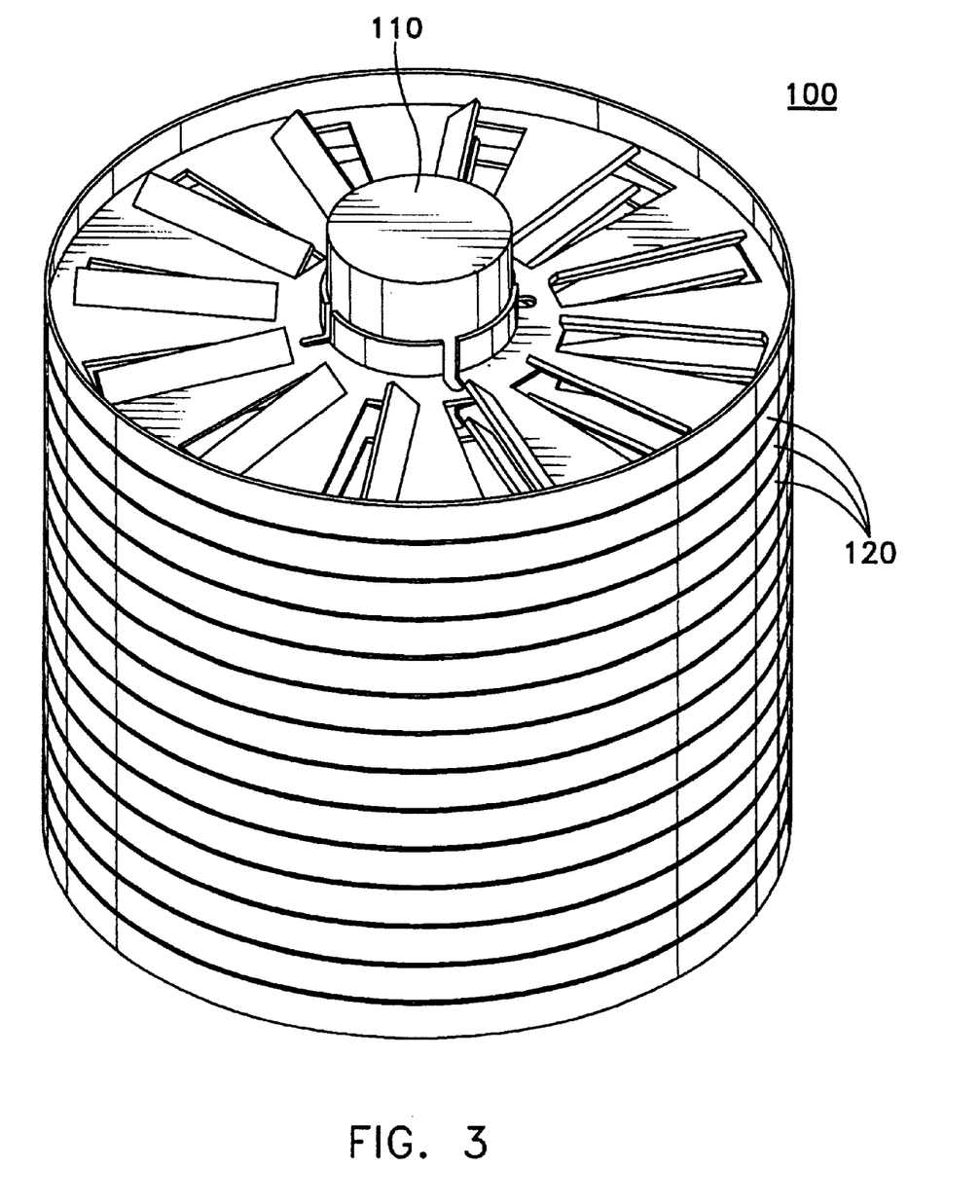
FIG. 3 shows the fin stack of FIG. 1, completely filled with fin disks.

Flow openings 126 permit air to flow through the fin disks, and flow guides 127 assist in directing the air as it passes through the flow openings. Flow guides 127 are preferably disposed at an angle between 0° and 90° with respect to the primary plane of circular base 121. It will be noted that the flow guides 127 shown in FIG. 2 are disposed at an angle of approximately 45° with respect to the primary plane of the 121. When fin disks 120 are placed one on top of the other, as shown in FIGS. 1 and 3, flow openings 126 of adjacent fin disks 120 are preferably staggered with respect to one another so that a helical air flow path is created. In particular, flow openings 126 of fin disks 120 disposed on either side of a central fin disk 120 are offset with respect to the flow openings of the central fin disk (i.e., the flow openings 126 are not directly overtop of each other in adjacent fin disks 120). This allows a more diagonal or helical flow of air through fin disks 120 as opposed to the vertical air flow that would occur if the flow openings were directly over each other. As stated above, fin disks 120 preferably include alignment notches 129 for permitting alignment of the fin disks in such a manner (See FIGS. 1 and 7).

Although FIGS. 1 and 2 show fin disks 120 with flow guides 127, these flow guides are not always required for operation of the present invention. If fin disks 120 were formed without the flow guides 127, air would still flow therethrough. Additionally, although FIG. 2 shows the flow openings as substantially rectangular, round or elliptical flow openings may also be used without departing from the scope of the present invention.

FIG. 3 shows fin stack 100 with a plurality of fin disks 120 disposed thereon. As shown in the figure, continuous lips 122 of fin disks 120 inter engage one another so as to mate with each other to form a substantially continuous wall which is concentric with elongate post 110. The substantially continuous wall created by the interlocking of continuous lips 122 of fin disks 120 prohibits air from escaping from fin stack 100 as it travels therethrough. As explained above, each fin disk 120 in fin stack 100 is preferably offset with respect to the fin disk on either side thereof. This arrangement allows air to flow through fin stack 100 in a substantially helical motion. In the exemplary fin stack shown in FIGS. 1 and 3, air flow is typically from the bottom of the fin stack (i.e., where base portion 111 of elongate post 110 is disposed) to the top of the fin stack in a helical flow pattern.

Figure 4:
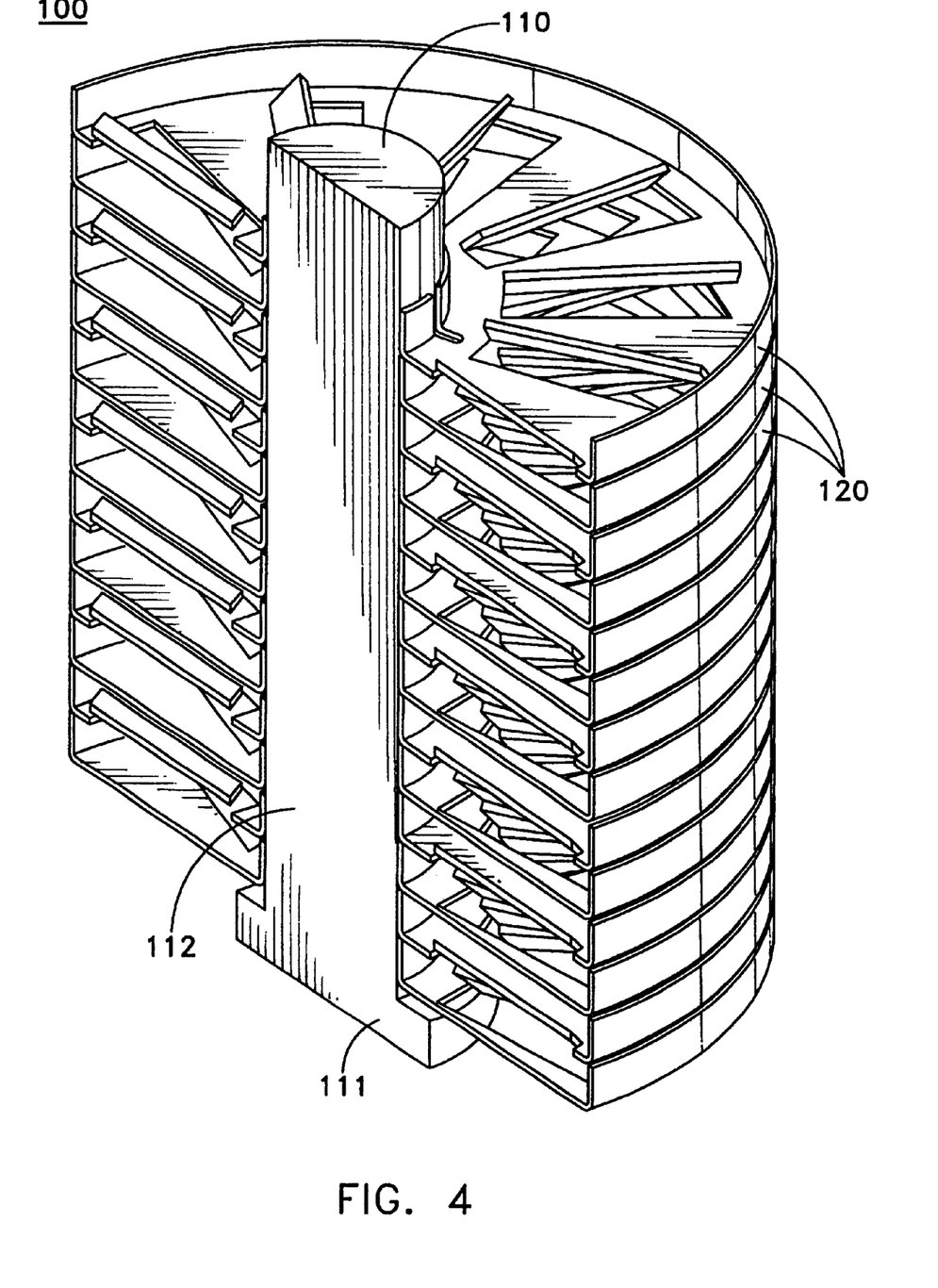
FIG. 4 shows a cross-sectional view of the fin stack of FIG. 3.

Referring to FIG. 4, air flow cavities are created by fin disks 120 when they are disposed on elongate post 110. As will be noted, fin disks 120 are all arranged so that flow guides 127 point in the same direction. However, fin disks 120 may be arranged so that flow guides 127 face in opposite directions on successive fin disks. Such a structure would permit the air flow to follow an undulating path through fin stack 100, rather than the helical path discussed above. An undulating air flow path may have slightly better thermal performance than the helical path, however, the pressure drop for the path may be higher, and thus not a sufficient trade for the improved thermal performance.

Figure 5:
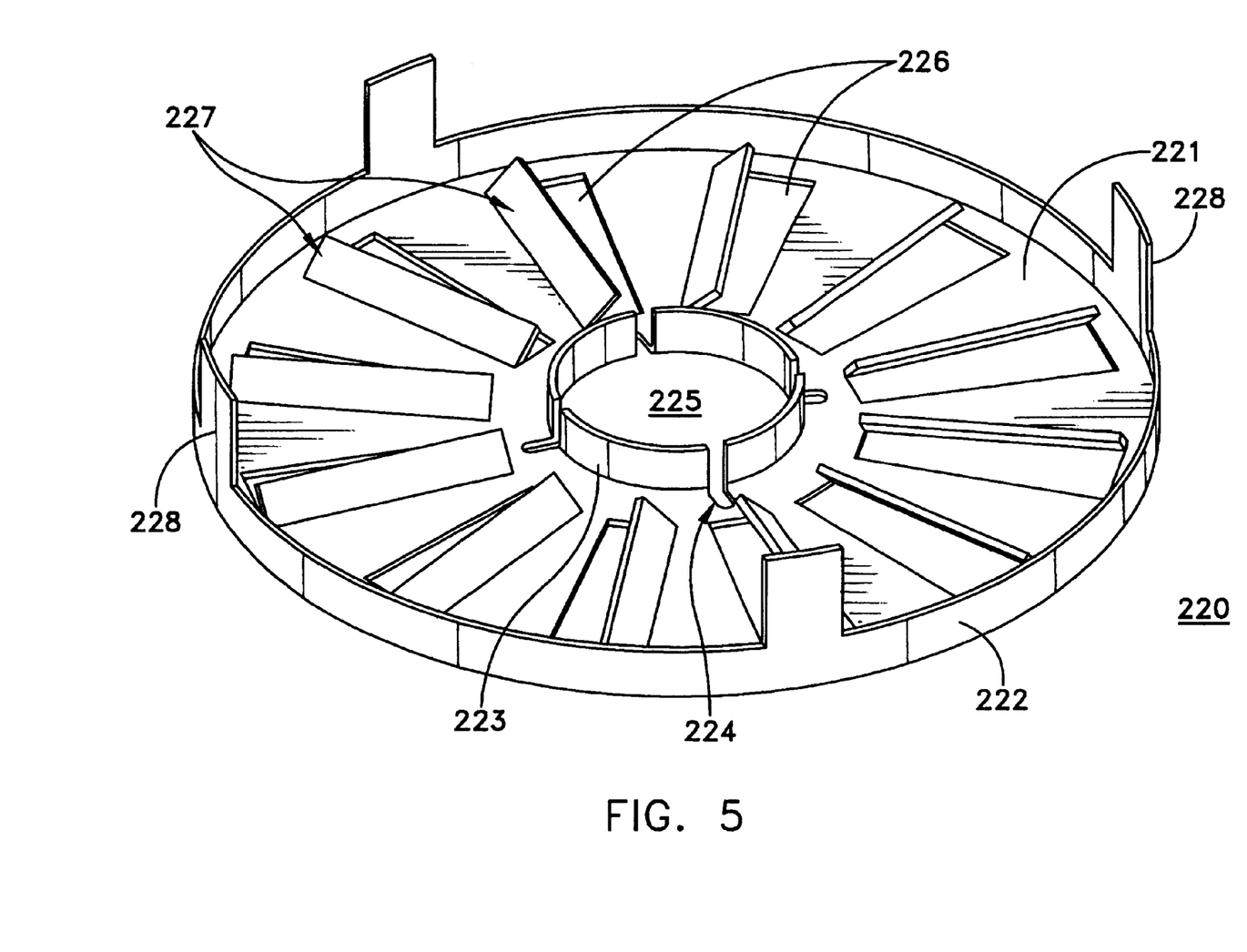
FIG. 5 shows a fin disk according to a second exemplary embodiment of the present invention.

FIG. 5 shows a fin disk 220 according to a second exemplary embodiment of the present invention. As with fin disk 120, fin disk 220 comprises a substantially circular base 221 with a continuous annular lip 222 disposed at its peripheral edge. Base 221 also includes a centrally-disposed substantially circular opening 225 for receiving column portion 112 of elongate post 110 (See FIG. 1). A centrally-disposed lip 223, including a plurality of slots 224, surrounds opening 225. Base 221 also includes a plurality of flow openings 226, and a plurality of flow guides 227 disposed adjacent the flow openings 226. Additionally, lip 222 includes a plurality of circumferentially spaced tabs 228. Tabs 228 are utilized to secure fin disk 220 to a circulation device (e.g., fan). Because of tabs 228, fin disk 220 may be used as the uppermost fin disk in a fin stack (See FIG. 7).

As with fin disk 120, flow openings 226 permit air to flow through fin disk 220, and flow guides 227 assist in directing the air as it passes through the flow openings. Flow guides 227 are preferably disposed at an angle of between 0° and 90° with respect to the primary plane circular base 221. It will be noted that flow guides 227 (FIG. 5) are disposed at an angle of approximately 45° with respect to the primary plane of base 221. As noted above with respect to fin disk 120, although fin disk 220 includes flow guides 227, such flow guides are not required for adquate operation of the fin disk.

Figure 6:
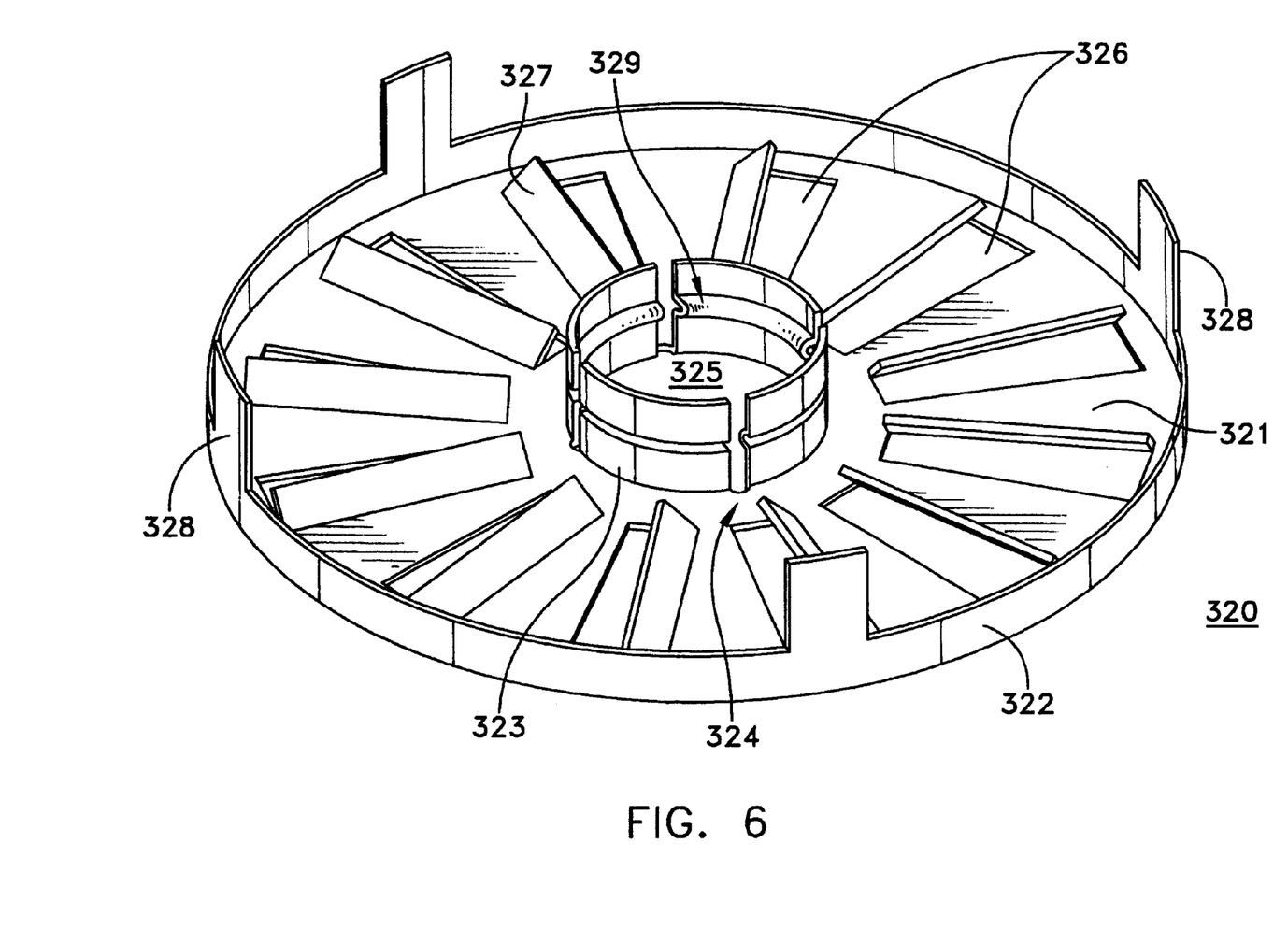
FIG. 6 shows a fin disk according to a third exemplary embodiment of the present invention.

FIG. 6 shows a fin disk 320 according to a third exemplary embodiment of the present invention. As with fin disks 120 and 220 discussed above, fin disk 320 comprises a substantially circular base 321 with a continuous annular lip 322 disposed on its peripheral edge. Base 321 also includes a centrally-disposed substantially circular opening 325 sized to receive the column portion 112 of elongate post 110 (See FIG. 1). A centrally-disposed annular lip 323, including a plurality of slots 324, surrounds opening 325. Base 321 also includes a plurality of flow openings 326. Flow guides 327 are formed in fin disk 320 adjacent to flow openings 326. Additionally, fin disk 320 includes a radially inwardly projecting notch 329 spanning the circumference of lip 323 which may be used for securing fin disk 320 to a metal post 750 (See FIGS. 10–11).

As with fin disks 120 and 220, flow openings 326 permit air to flow through fin disk 320. Fin disk 320 may not include flow guides.

Figure 7:
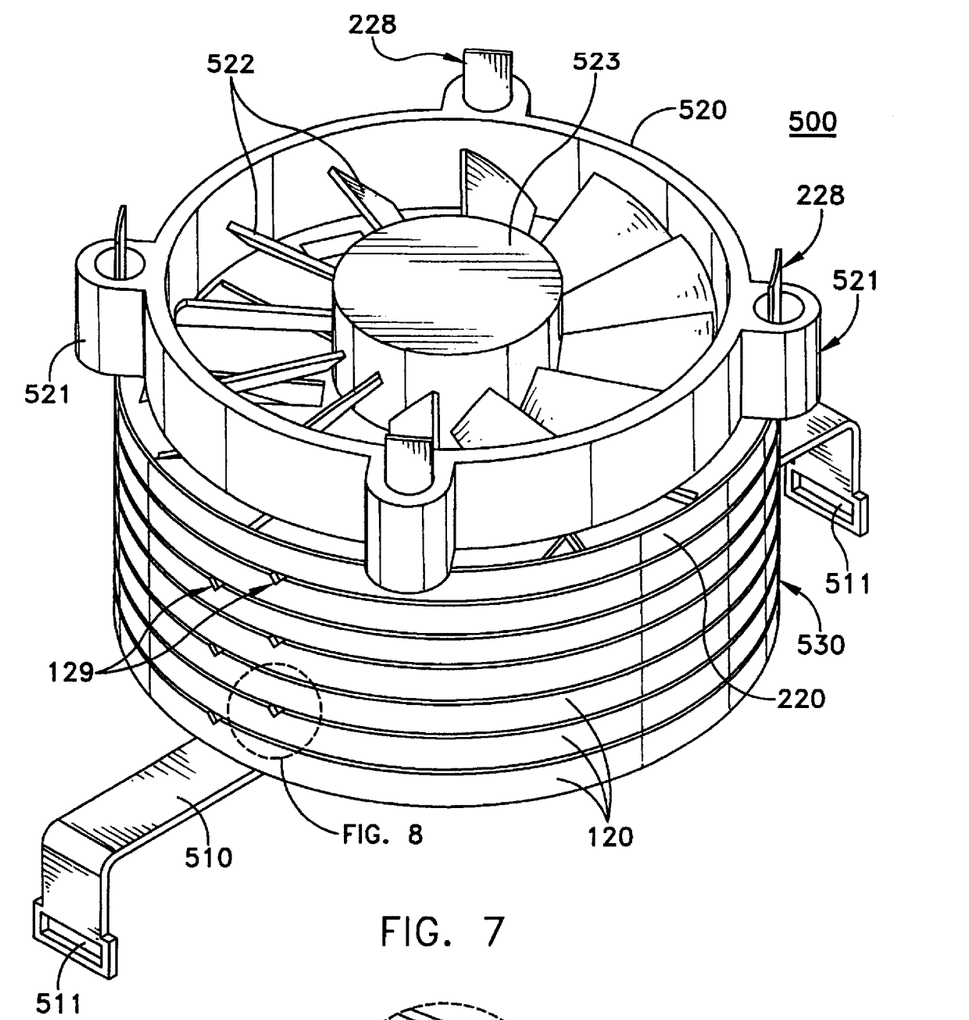
FIG. 7 shows a heat exchanger device according to a first exemplary embodiment of the present invention utilizing fin disks according to the first and second exemplary embodiments of the present invention.

FIG. 7 shows a heat exchanger apparatus 500 according to a first exemplary embodiment of the present invention. Heat exchanger 500 includes a clip 510 for securing the heat exchanger to a heat-producing apparatus (not shown, e.g., a microprocessor), a circulation device 520 (e.g., fan), and a fin stack 530. Fin stack 530 is preferably comprised of a plurality of fin disks 120 according to a first exemplary embodiment of the present invention, and at least one fin disk 220 according to a second exemplary embodiment of the present invention.

Clip 510 of heat exchanger apparatus 500 preferably includes loops 511 for assisting in securing the clip and the heat exchanger apparatus to a heat-producing apparatus (e.g., heat pipe, etc.). Circulation device 520 preferably comprises a fan or other equivalent circulation means, with a central hub 523 and a plurality of fan blades 522. Central hub 523 includes a motor which powers circulation device 520. Circulation device 520 also preferably includes openings 521 for receiving tabs 228 of fin disk 220. In order to permanently secure circulation device 520 to fin stack 530, tabs 228 may be bent back or otherwise deformed once circulation device 520 has been placed on fin disk 220, so as to prevent the circulation device from moving away from the fin stack. Alternatively, caps or other securing members may be placed over tabs 228 in order to prevent circulation device 520 from being removed from fin stack 530.

Figure 8:
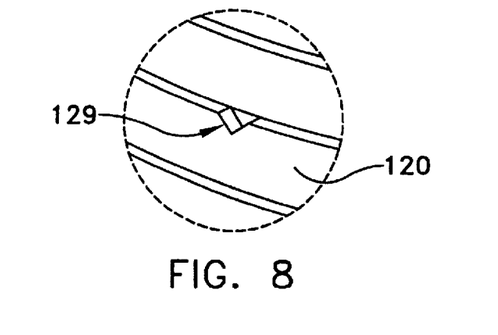
FIG. 8 shows an magnified view of a portion of the heat exchanger device of FIG. 7.

As shown in FIG. 7, each of fin disks 120 includes an alignment notch 129 which assists in aligning fin disks 120 with respect to each other. FIG. 8 shows a magnified view of a portion of one of the fin disks 120, showing one of the alignment notches 129 in detail. In the exemplary heat exchanger apparatus 500, alignment notches 129 are offset with respect to each other as between adjacent fin disks 120. All fin disks 120 are manufactured with alignment notch 129 in the same position, and thus, by offsetting the notches between adjacent fin disks 120, a helical air path may be created in fin stack 530. This helical air path allows for a more efficient transfer of heat away from the heat-producing apparatus, through fin stack 530, and out from circulation device 520.

In operation, circulation device 520 creates an air flow through fin stack 530 in a direction away from clip 510. Since clip 510 will be attached to a heat producing apparatus, this operation draws heat generated by the heat-producing apparatus away from the apparatus through fin stack 530 and toward circulation device 520. This heated air then exits circulation device 520 on the side opposite fin stack 530. Removal of such heated air from the air surrounding the heat-producing apparatus permits the apparatus to operate at higher temperatures. With respect to a microprocessor or semiconductor device, as the heat-producing apparatus, higher operating temperatures translate directly to more operations for the device per unit of time.

FIG. 8 shows an magnified view of a portion of fin disk 120 shown in FIG. 7. This magnified view shows that the fin disks each include an alignment notch 129. Although this alignment notch is shown as being triangular shaped in FIG. 8, the alignment notch may be of any suitable geometric shape.

Figure 9:
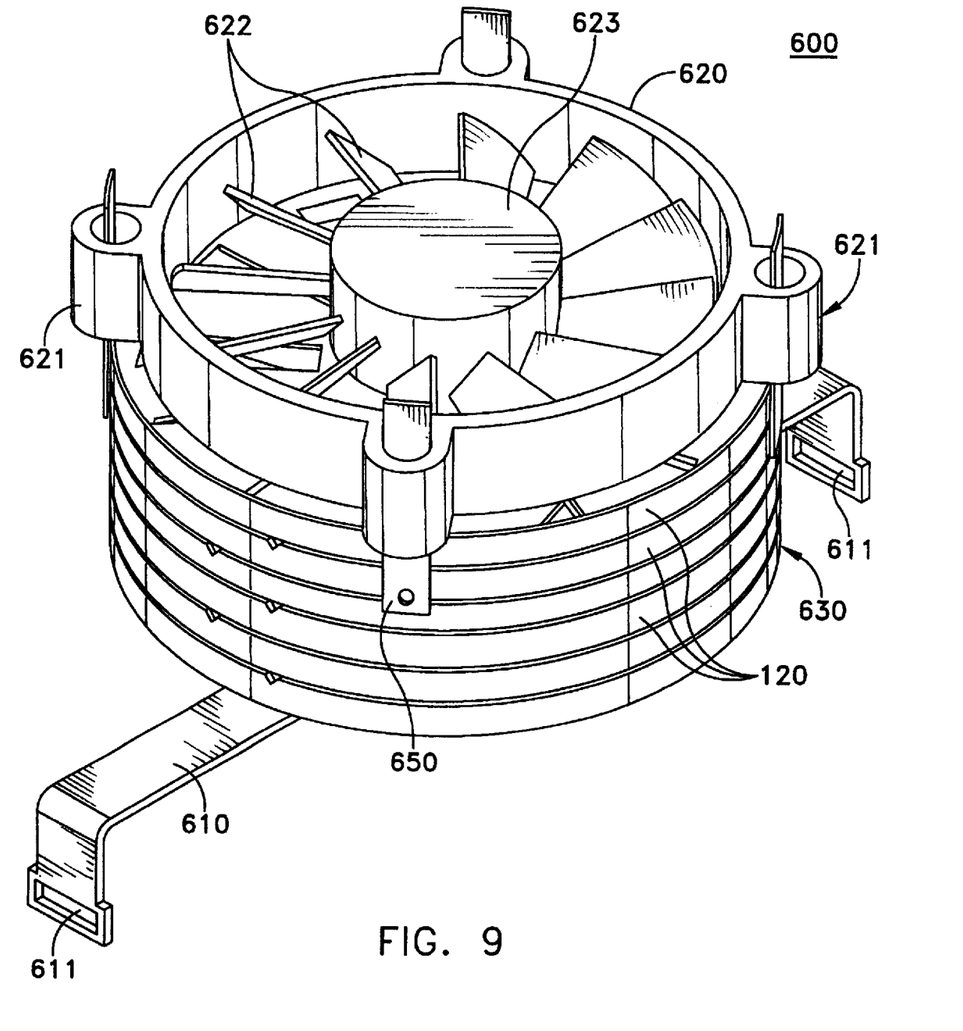
FIG. 9 shows a heat exchanger device according to a second exemplary embodiment of the present invention utilizing fin disks according to the first exemplary embodiment of the present invention.

FIG. 9 shows a heat exchanger apparatus 600 according to a second exemplary embodiment of the present invention. Heat exchanger apparatus 600 is similar to heat exchanger apparatus 500, and like reference numerals denote like elements. Heat exchanger 600 includes a clip 610 for securing the heat exchanger to a heat-producing apparatus (not shown, e.g., a microprocessor), a circulation device 620 (e.g., fan), and a fin stack 630. Fin stack 630 is preferably comprised of a plurality of fin disks 120 formed according to a first exemplary embodiment of the present invention. As opposed to fin stack 530 of heat exchanger apparatus 500, fin stack 630 does not include a fin disk 220. Instead, tabs 650 for securing circulation device 620 are manufactured separately and secured to one of the fin disks 120 by means of screws, bolts, rivets, or other equivalent attachment means. As will be understood, tabs 650 may be similar in configuration to tabs 228 of fin disk 220.

Figure 10:
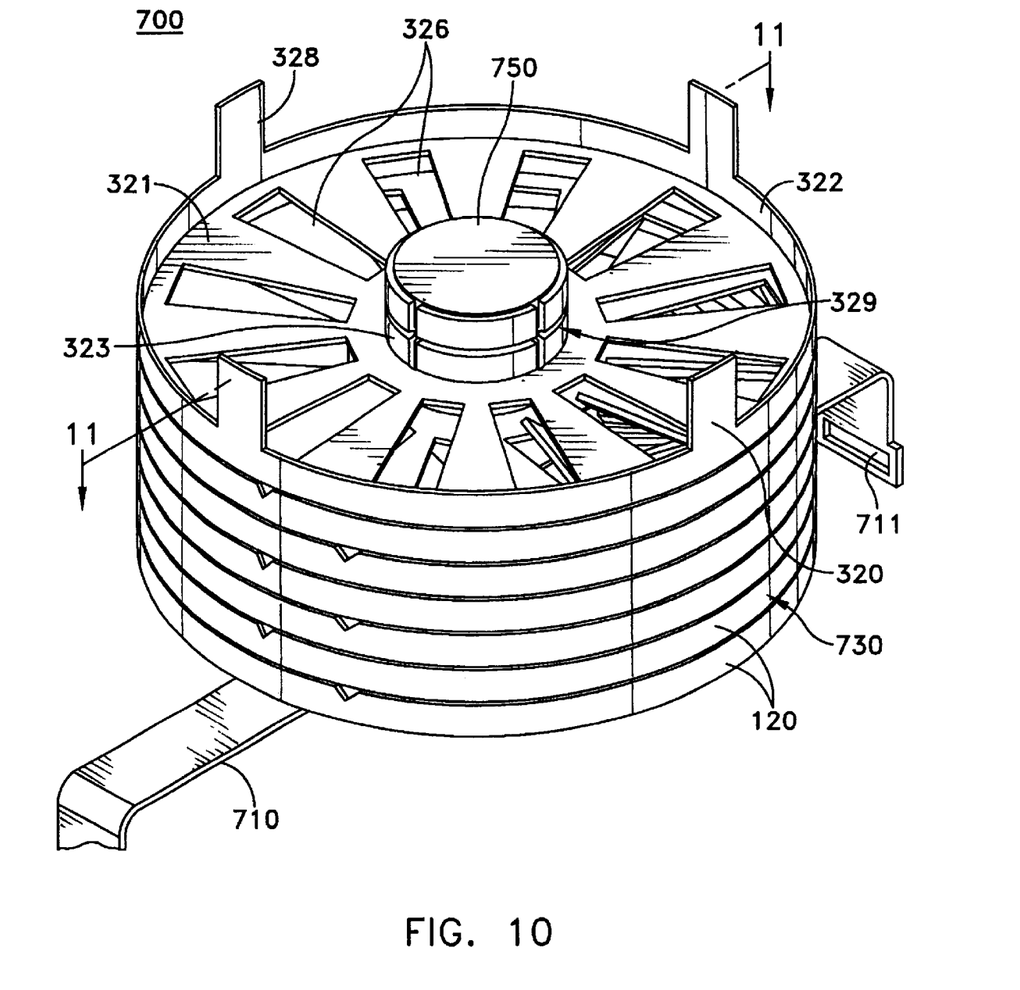
FIG. 10 shows a heat exchanger device according to a third exemplary embodiment of the present invention utilizing fin disks according to the first and third exemplary embodiments of the present invention.
Figure 11:
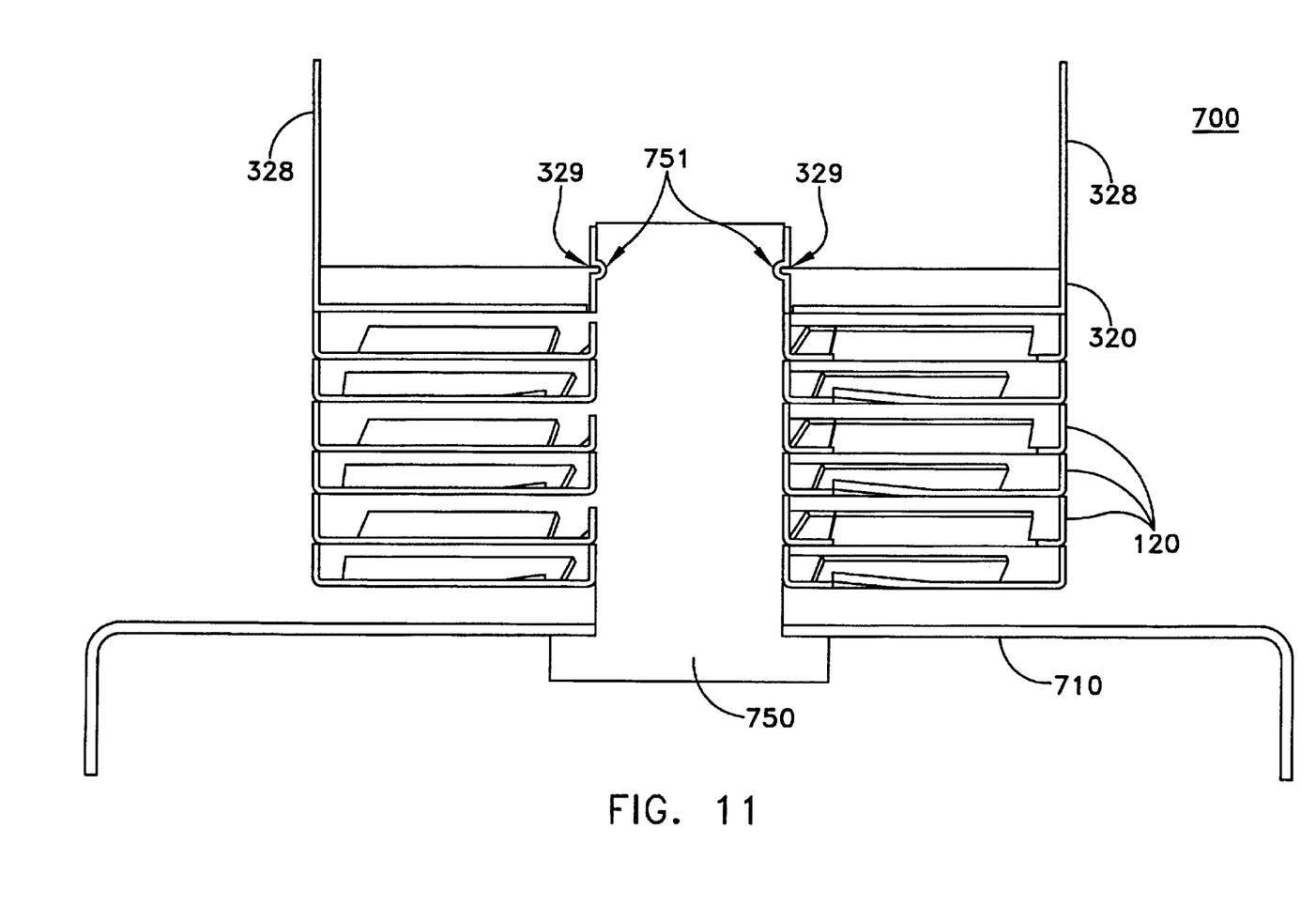
FIG. 11 shows a cross-sectional view of the heat exchanger device shown in FIG. 10.

FIGS. 10 and 11 show heat exchanger apparatus 700 according to a third exemplary embodiment of the present invention. Heat exchanger apparatus 700 is similar to heat exchanger apparatus 500, and like reference numerals denote like elements. Heat exchanger 700 includes a clip 710 for securing the heat exchanger to a heat-producing apparatus (not shown, e.g., a microprocessor), a circulation device (not shown, e.g., fan), and a fin stack 730. Fin stack 730 is preferably comprised of a plurality of fin disks 120 according to a first exemplary embodiment of the present invention, and at least one fin disk 320 according to the third exemplary embodiment of the present invention (See FIG. 6).

As opposed to heat exchanger apparatus 500, elongate post 750 includes an annular groove 751 for receiving notch 329 of fin disk 320. The manner in which notch 329 is secured in the groove 751 of the elongate post 750 may be discerned more easily by reference the cross-sectional view of the heat exchanger apparatus 700 shown in FIG. 11. Forming an annular groove in the elongate post 750 permits the uppermost fin disk 320 to be secured to the post without the need for screws, adhesives or other attachment means.

Alternatively from providing an annular groove 751 in elongate post 750 which mates with a notch 329 in fin disk 320, those of ordinary skill in the art will note that the elongate post may be provided with a thread (or other equivalent attachment means) at an upper portion which mates with a thread formed on the fin disk. Then, the fin disk may be screwed onto the elongate post to secure the fin disk thereto.

Although the invention has been described in terms of exemplary embodiments, it is not limited thereto. Rather, the appended claims should be construed broadly, to include other variants and embodiments of the invention which may be made by those skilled in the art without departing from the scope and range of equivalents of the invention.

What is claimed is:

1. An air flow apparatus comprising:

an elongate post; and a plurality of fin disks disposed on the elongate post, each fin disk including a centrally disposed opening for receiving the elongate post, and a plurality of flow openings disposed around the periphery of the centrally disposed opening wherein at least one of the plurality of fin disks includes a centrally disposed lip with an annular notch formed and wherein the elongate post includes an annular groove for receiving the annular notch.

2. The air flow apparatus of claim 1 wherein the elongate post is substantially cylindrical and the plurality of fin disks are substantially circular.

3. The air flow apparatus of claim 1 further comprising flow guides disposed adjacent each of the flow openings.

4. The air flow apparatus of claim 1 wherein at least one of the plurality of fin disks includes at least two tabs extending therefrom.

5. The air flow apparatus of claim 1 wherein adjacent fin disks of the plurality of fin disks are offset with respect to one another so as to create a helical air flow path.

6. The air flow apparatus of claim 1 wherein each of the fin disks of the plurality of fin disks includes an alignment notch for aligning the fin disk with respect to other fin disks in the plurality of fin disks.

7. A heat exchanger system comprising:

an air flow apparatus including an elongate post and a plurality of fin disks disposed on the elongate post, each fin disk including a centrally disposed opening for receiving the elongate post, and a plurality of flow openings disposed around the periphery of the centrally disposed opening; and a circulation device wherein at least one of the plurality of fin disks Includes a centrally disposed lip with an annular notch formed therein, and wherein the elongate post includes an annular groove for receiving the annular notch.

8. The heat exchanger system of claim 7 wherein at least one of the plurality of fin disks includes at least two tabs extending therefrom for receiving the circulation device.

9. The heat exchanger system of claim 8 wherein adjacent fin disks of the plurality of fin disks are offset with respect to one another so as to create a helical air flow path through the air flow apparatus.

10. A computer comprising:

at least one electronic component that produces heat; and at least one heat exchanger system coupled to the at least one electronic component, said heat exchanger system including an air flow apparatus including an elongate post and a plurality of fin disks disposed on the elongate post, each fin disk including a centrally disposed opening therein for receiving the elongate post, and a circulation device wherein at least one of the plurality of fin disks includes a centrally disposed lip with an annular notch formed therein, and wherein the elongate post includes an annular groove for receiving the annular notch.

* * * * *

UNITED STATES PATENT AND TRADEMARK OFFICE
CERTIFICATE OF CORRECTION

PATENT NO. : 6,712,128 B1
DATED : March 30, 2004
INVENTOR(S) : Peter M. Dussinger et al.

It is certified that error appears in the above-identified patent and that said Letters Patent is hereby corrected as shown below:

Column 6,
Line 42, change "Includes" to -- includes --

Signed and Sealed this

Twentieth Day of July, 2004

JON W. DUDAS
*Acting Director of the United States Patent and Trademark Office*